US008884524B2

(12) United States Patent
Zhou et al.

(10) Patent No.: US 8,884,524 B2
(45) Date of Patent: Nov. 11, 2014

(54) APPARATUS AND METHODS FOR IMPROVING RELIABILITY OF RF GROUNDING

(75) Inventors: Jianhua Zhou, Campbell, CA (US); Dale R. Du Bois, Los Gatos, CA (US); Mohamad A. Ayoub, Los Gatos, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 375 days.

(21) Appl. No.: 13/302,012

(22) Filed: Nov. 22, 2011

(65) Prior Publication Data

US 2013/0126206 A1    May 23, 2013

(51) Int. Cl.
*H05B 31/26*    (2006.01)
*H01J 37/32*    (2006.01)

(52) U.S. Cl.
CPC ..... *H01J 37/32091* (2013.01); *H01J 37/32577* (2013.01)
USPC .................... 315/111.21; 315/111.81; 315/39

(58) Field of Classification Search
USPC .................................. 315/111.21, 111.81, 39
See application file for complete search history.

(56) References Cited

U.S. PATENT DOCUMENTS

| 6,445,567 | B1* | 9/2002 | Komatsuki et al. ........... 361/518 |
| 7,354,288 | B2 | 4/2008 | Maehara et al. |
| 2003/0141820 | A1* | 7/2003 | White et al. ............. 315/111.21 |
| 2006/0272774 | A1 | 12/2006 | Maehara et al. |
| 2009/0314208 | A1 | 12/2009 | Zhou et al. |
| 2011/0147363 | A1 | 6/2011 | Yap et al. |

FOREIGN PATENT DOCUMENTS

| JP | 06-097118 A | 4/1994 |
| JP | 06-236858 A | 8/1994 |
| JP | 11-330058 A | 10/2009 |
| JP | 2009-231683 A | 10/2009 |
| JP | 2010-219354 A | 9/2010 |

OTHER PUBLICATIONS

International Search Report and Written Opinion, Application PCT/US2012/063591, dated Mar. 4, 2013.

* cited by examiner

*Primary Examiner* — Douglas W Owens
*Assistant Examiner* — Jianzi Chen
(74) *Attorney, Agent, or Firm* — Patterson & Sheridan, LLP

(57) ABSTRACT

Embodiments of the present invention provide an RF conducting rod comprising a hollow portion. Particularly, the RF conducting rod comprises an elongated hollow body having a sidewall enclosing an inner volume, a first solid connector extending from a first end of the elongated hollow body, and a second solid connector extending from a second end of the elongated hollow body. Each of the elongated hollow body, the first solid connector and the second solid connector is formed from an electrically conductive material.

19 Claims, 4 Drawing Sheets

APPARATUS AND METHODS FOR IMPROVING RELIABILITY OF RF GROUNDING

BACKGROUND OF THE INVENTION

1. Field of the Invention

Embodiments of the present invention generally relate to apparatus and methods for improving reliability of electrical connections at radio frequency (RF). Particularly, embodiments of the present invention relate to apparatus and methods for improving reliability of RF grounding at high temperatures.

2. Description of the Related Art

A substrate support having an embedded RF electrode is usually used in a plasma enhanced process, for example, plasma enhanced physical vapor deposition (PECVD). The substrate support generally has a non-conductive body, such as a ceramic body. One or more heating element may be included in the substrate support to provide heating during processing. The RF electrode is typically connected to a RF power source through a series of metal parts including clamps and straps to accommodate some relative motions caused by thermal expansion. The clamps and straps are generally made of metals with minimal resistivity (copper) and with a coating (of gold or nickel) to prevent oxidation.

However, many issues arise from traditional RF connection, particularly when the substrate support is heated to a temperature higher than 400° C. or the RF power is above 1000 W. The coating on the clamps and straps tend to fail when the temperature of the clamps and straps is higher than 250° C. causing oxidation. The oxidation on the surface of the clamps and straps leads to arcing in the chamber, thus negatively affect the processing. High temperature may also cause the clamps and straps to lose flexibility needed to maintain electrical contact between the RF power source and the RF electrode. The clamps and straps may even break at high temperature.

Therefore, there is need for apparatus and methods to improve reliability of electrical contact between an RF electrode and a RF power source.

SUMMARY OF THE INVENTION

The present invention generally provides apparatus and methods for generating a plasma in a processing chamber. Particularly, embodiments of the present invention provides an RF conducting rod comprising a hollow portion.

One embodiment of the present invention provides an apparatus for conducting RF power. The apparatus comprises an elongated hollow body having a sidewall enclosing an inner volume, a first solid connector extending from a first end of the elongated hollow body, and a second solid connector extending from a second end of the elongated hollow body. Each of the elongated hollow body, the first solid connector and the second solid connector is formed from an electrically conductive material.

Another embodiment of the present invention provides a substrate support. The substrate support comprises a support body having a substrate supporting surface and an RF electrode embedded in the support body. The support body is formed from a non-electrically-conductivity material. The substrate support further comprises an RF connector coupled to the RF electrode. The RF connector comprises an elongated hollow body having a sidewall enclosing an inner volume, a first solid connector extending from a first end of the elongated hollow body, and a second solid connector extending from a second end of the elongated hollow body. Each of the elongated hollow body, the first solid connector and the second solid connector is formed from an electrically conductive material, and the second solid connector is coupled to the RF electrode.

Another embodiment of the present invention provides a method for generating a plasma. The method comprises applying an RF power source between a chamber component and a substrate support. The substrate support comprises a support body having a substrate supporting surface, and an RF electrode embedded in the support body. The support body is formed from a non-electrically-conductivity material. The substrate support further comprises an RF electrode embedded in the support body and an RF connector coupled to the RF electrode. The RF connector comprises an elongated hollow body having a sidewall enclosing an inner volume, a first solid connector extending from a first end of the elongated hollow body, and a second solid connector extending from a second end of the elongated hollow body. Each of the elongated hollow body, the first solid connector and the second solid connector is formed from an electrically conductive material. The second solid connector is coupled to the RF electrode, and the first solid connector is coupled to an RF ground terminal or an RF hot terminal of the RF power source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention relate to apparatus and methods for improving reliability of electrical connection at radio frequency at high temperatures. Particularly, embodiments of the present invention provide a RF connecting device comprising an elongated hollow body configured to reduce thermal conductivity and reduce RF heating in the RF connecting device.

Figure 1:
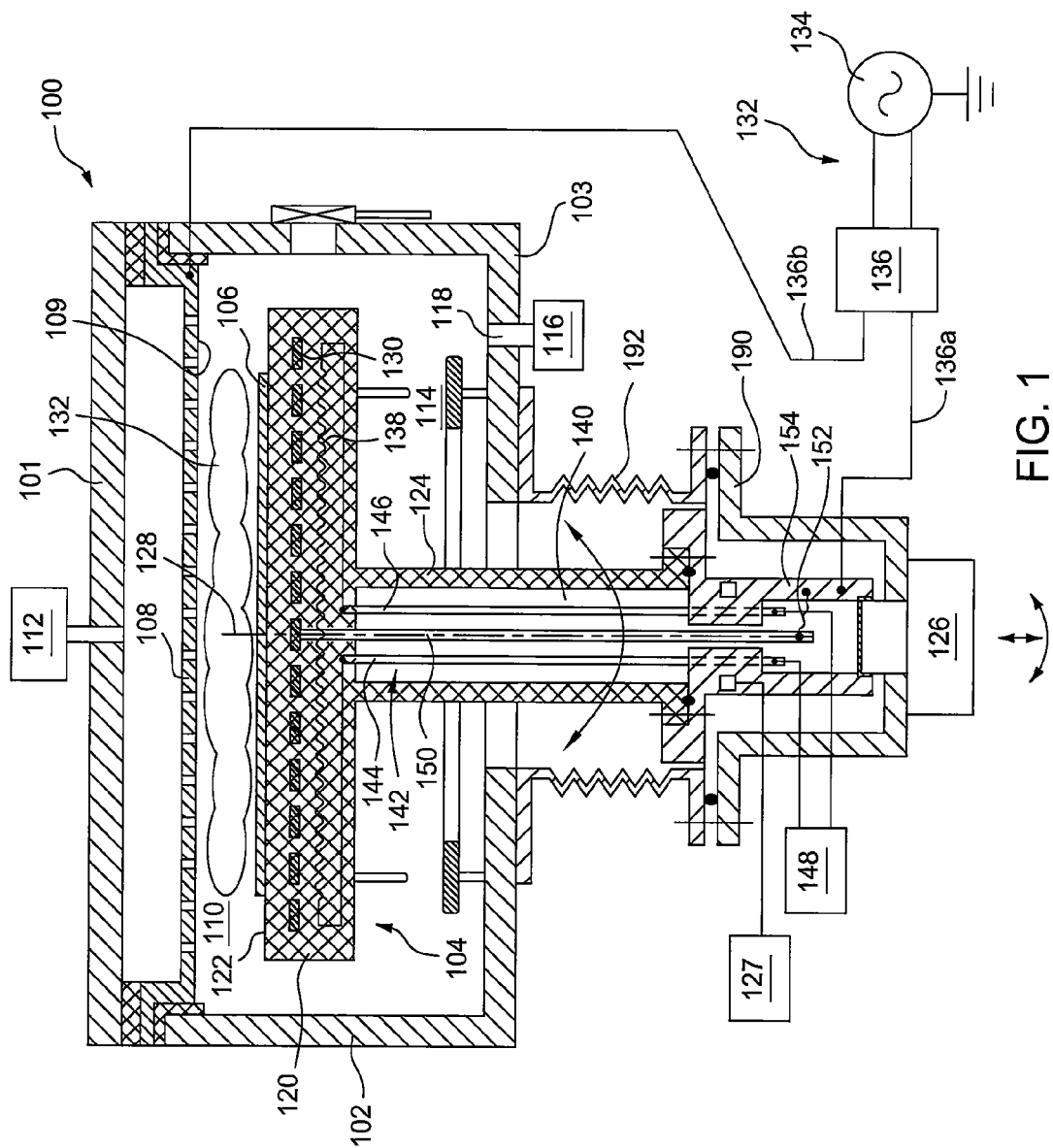
FIG. 1 is a schematic sectional view of a plasma processing chamber according to one embodiment of the present invention.

FIG. 1 is a schematic sectional view of a plasma processing chamber 100 according to one embodiment of the present invention. The plasma processing chamber 100 includes a chamber lid 101, sidewalls 102, and a chamber bottom 103. The chamber lid 101, sidewalls and chamber bottom 103 define a chamber enclosure 114. A substrate support 104 is disposed within the chamber enclosure 114. The substrate support 104 is configured to support one or more substrates 106 for processing in the chamber enclosure 114.

A gas distribution showerhead 108 is disposed over the substrate support 104. The gas distribution showerhead 108 is configured to deliver one or more processing gas from a process gas source 112 to a processing zone 110 formed between the substrate support 104 and the gas distribution showerhead 108 within the chamber enclosure 114. An exhaust assembly 116 may be connected to the chamber enclosure 114 through an exhaust port 118 to pump out the chamber enclosure 114.

The substrate support 104 includes a support body 120 coupled to a shaft 124. The substrate support 104 also includes an RF electrode 130 for generating a plasma 132 between the substrate support 104 and the gas distribution showerhead 108. The RF electrode 130 may be embedded in the support body 120. Optionally, the substrate support 104 may include a heating element 138 to heat the substrate 106 disposed on the support body 120.

The support body 120 may be substantially flat having an upper surface 122 for supporting the substrate 106 thereon. The upper surface 122 faces a lower surface 109 of the gas distribution showerhead 108 and may be substantially parallel to the gas distribution showerhead 108. The support body 120 may be substantially circular, rectangular, squared, or of other shape depending on the shape of the substrate 106 being processed and/or the shape of the chamber enclosure 114. The support body 120 may be formed for ceramics, or other non-electrically conductive material capable of withstanding the plasma environment in the chamber enclosure 114. In one embodiment, the support body 120 may be a unitary monolith structure composed of aluminum nitride or aluminum oxide.

The shaft 124 extends through the chamber bottom 103 and connects to a drive mechanism 126 through a cooling connector 154. The cooling connector 154 is formed from a metallic material, such as aluminum. The drive mechanism 126 is configured to move the support body 120 vertically within the chamber enclosure 114 to adjust the distance between the upper surface 122 of the support body 120 and the gas distribution showerhead 108. The vertical movement of the support body 120 may also enable loading and unloading of the substrate 106. The drive mechanism 126 may also rotate the support body 120 and the shaft 124 about a central axis 128 of the shaft 124. The shaft 124 may be formed from the same non-electrically conductive material as the support body 120.

The shaft 124 is hollow having an inner opening 140 extending along the central axis 128. The inner opening 140 accommodate electrical connections to the RF electrode 130 and the heating element 138. The shaft 124 may be fixedly coupled to the cooling connector 154. In one embodiment, the cooling connector 154 may include cooling channels 155 connected to a cooling assembly 127 and being cooled during processing. A bellows 192 and a lower cover 190 surrounding the shaft 124 may be coupled to the chamber body 103 to provide seal the chamber enclosure 114 while allowing motions of the shaft 124.

The RF electrode 130 is formed from a metallic material. The RF electrode 130 may be disposed within the support body 120 spreading across an area corresponding to the substrate 106. In one embodiment, the RF electrode 130 includes a metallic mesh embedded in the support body 120. The metallic mesh may be made of a metal such as molybdenum.

The RF electrode 130 is coupled to a RF connector assembly 142 disposed in the inner opening 140 of the shaft 124 and a lower cavity 194 of the cooling connector 154. The RF connector assembly 142 extends through the shaft 124 and may be connected to a RF power source 134 through a matching network 136. The RF power source 134 may be connected through the matching network 136 to one or more chamber components in the processing chamber 100 for generating plasma within the processing chamber 100. The RF power source 134 is capable of providing RF power of from about 100 watts to about 5000 watts to the RF electrode 130 and the one or more chamber components.

As shown in FIG. 1, the RP power source 134 is connected to the gas distribution showerhead 108 through the matching network 136 to generate plasma between the substrate support 104 and the gas distribution showerhead 108. The RF electrode 130 may be connected to an RF terminal 136a of the matching network 136. The gas distribution showerhead 108 may be connected to another RF terminal 136b of the matching network 136. In one embodiment, the RF terminal 136a is an RF grounding terminal and the RF terminal 136b is an RF hot terminal so that the RF electrode 130 is RF grounded and the one or more chamber component, such as the gas distribution showerhead is RF hot. Alternatively, the RF terminal 136a is an RF hot terminal and the RF terminal 136b is an RF grounding terminal so that the RF electrode 130 is RF hot and one or more chamber components, such as the gas distribution showerhead 108 is RF grounded. In addition to generating plasma, the RF electrode 130 can also serve as an electrostatic attraction member to electrostatically hold the substrate 106 on the substrate support 104.

The heating element 138 may be connected to a power source 148 through terminal rods 144, 146 disposed in and extending along the inner opening 140 of the shaft 124. The power source 148 may provide a DC voltage to power the heating element 138. In one embodiment, the power source 148 may be capable of delivering from about 100 to about 4000 Watts of direct current to the heating element 138.

The heating element 138 may be a resistive heater. The heating element 138 may be an electrical resistor wire that generates heat upon application of a voltage across the wire. For example, the heating element 138 can be a metal wire having a cylindrical cross-section that is coiled concentrically to form a spiral from the center to the edge of support body 120. A suitable metal wire can be a molybdenum or nichrome wire.

Figure 2:
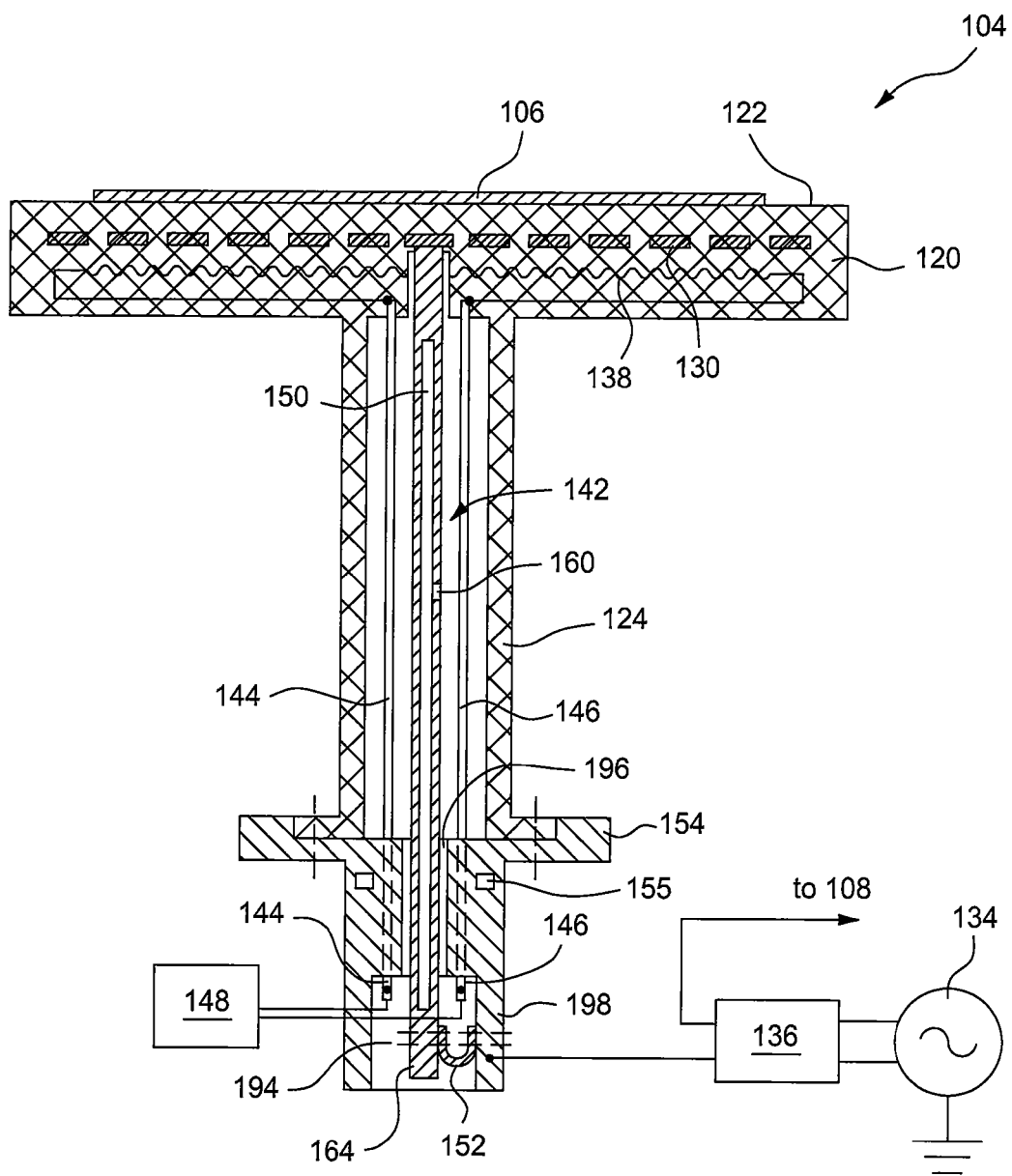
FIG. 2 is a schematic sectional view of a substrate support according to one embodiment of the present invention.

FIG. 2 is a schematic sectional view of the substrate support 104 illustrating the RF connector assembly 142 according to one embodiment of the present invention. The RF connector assembly 142 provides improved RF connection to the RF electrode 130 embedded in the substrate support 104 that is being heated due the RF power in the RF electrode 130 and/or the heating element 138.

The RF connector assembly 142 includes an RF conducting rod 150, and a flexible strap 152. The RF conducting rod 150 is directly coupled to the RF electrode 130 at one end and the flexible strap 152 at the other end. The cooling connector 154 may have through hole 196 and a lower cavity 194. The RF conducting rod 150 extends through the through hole 196 to the lower cavity 194 of the cooling connector 154. The flexible strap 152 is coupled between the RF conduction rod 150 and a sidewall 198 of the cooling connector 154 within the lower cavity 194. The cooling connector 154 may be further connected to the matching network 136 either by directly connecting to the RF terminal 136a or by connecting to the chamber body 103 through the lower cover 190. Thus, the RF electrode 130 may be RF grounded or RF powered by the RF power source 134 through the connection of the matching network 136, the cooling connector 154, the flexible strap 152, and the RF conducting rod 150.

Figures 3, 4:
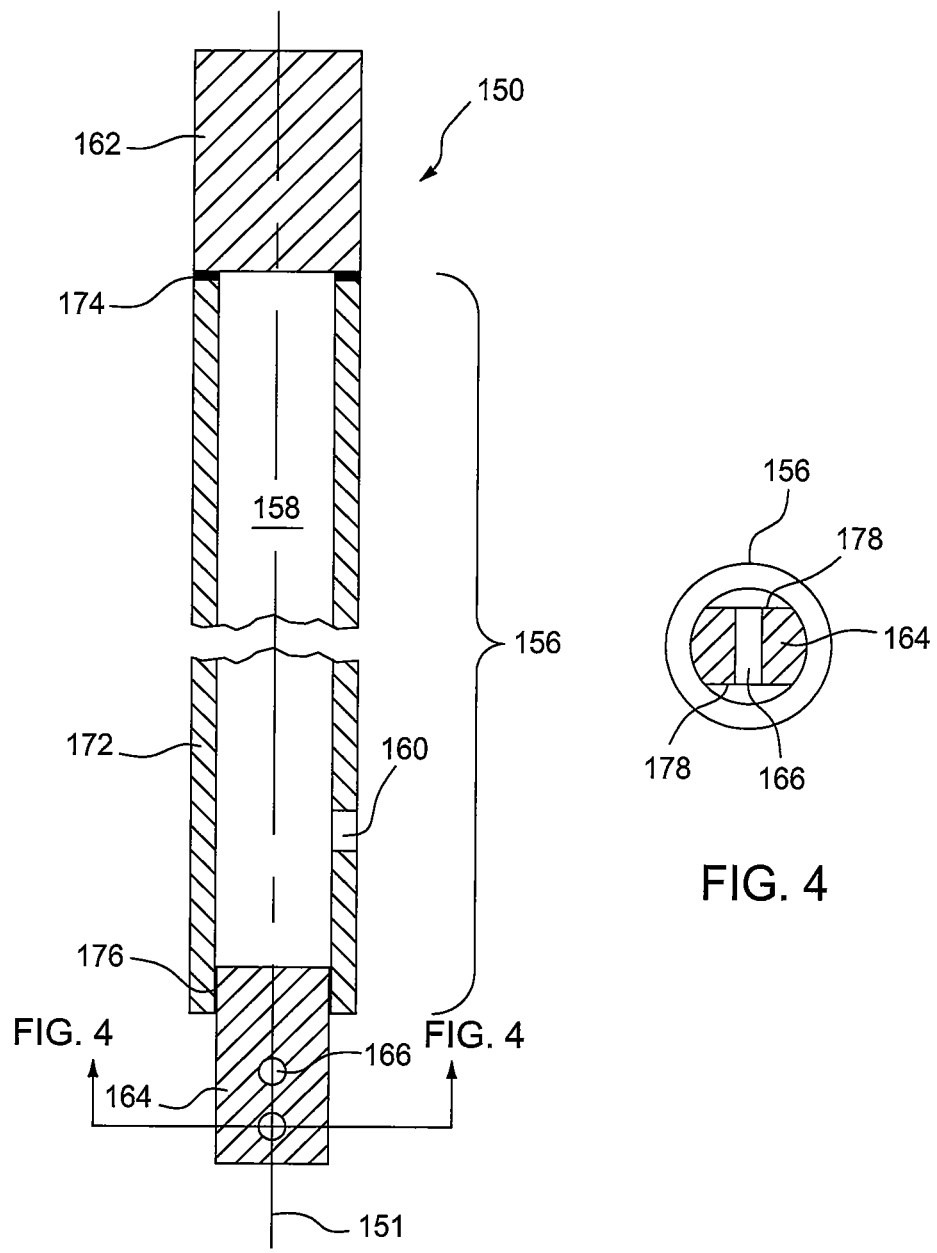
FIG. 3 is a schematic sectional side view of a RF conducting rod according to one embodiment of the present invention.
FIG. 4 is a schematic sectional view of the RF conducting rod of FIG. 3.

FIG. 3 is a schematic sectional view of the RF conducting rod 150 according to one embodiment of the present invention. The RF conducting rod 150 may have a length substantially similar to the length of the shaft 124 to provide an electronic connection through the shaft 124 to the RF electrode 130.

The RF conducting rod 150 includes an elongated hollow body 156 and solid ends 162, 164 connected to elongated hollow body 156 respectively. The elongated hollow body 156 is generally formed by a sidewall 172 enclosing an inner volume 158. The solid ends 162, 164 close the inner volume 158. A venting hole 160 may be formed through the sidewall 172 connecting the inner volume 158 to the exterior. The venting hole 160 prevents pressure unbalance between inside and outside the hollow RF conducting rod 150, particularly when the RF conducting rod 150 is being heated or cooled.

In one embodiment, the solid ends 162, 164 and the elongated hollow body 156 may be joined together from three separate parts. The solid ends 162, 164 and the elongated hollow body 156 are joined together through fusion bonding processes, such as e-beam welding or laser welding. Because fusion bonding processes do not use foreign materials in joints 174, 176, minimal electrical resistivity is introduced to the RF conducting rod 150 in the joints 174, 176. In one embodiment, the solid ends 162, 164 and the elongated hollow body 156 may be formed from the same metallic material, such as nickel.

The solid end 162 may include a portion of solid cylinder or other suitable shapes. The solid end 162 can be fixedly connected to the RF electrode 130 to make a solid junction. The solid end 162 may be joined to the RF electrode 130 via a brazing process.

The elongated hollow body 156 may be a metallic hollow tube. In one embodiment, the elongated hollow body 156 may be a cylindrical tube having a diameter of about 3 mm to about 10 mm. The sidewall 172 of the elongated hollow body 156 may have a thickness of between about 0.127 mm (0.005 inch) to about 0.5 mm (0.020 inch).

FIG. 4 is a schematic sectional view of the RF conducting rod 150 showing the solid end 164. The solid end 164 may include a portion of solid cylinder or other suitable shapes. In one embodiment, the solid end 164 may have flattened surfaces 178 for accommodating mounting features for the flexible strap 152. The solid end 164 may have one or more through holes 166 traversing an axis 151 of the RF conducting rod 150.

Figure 5:
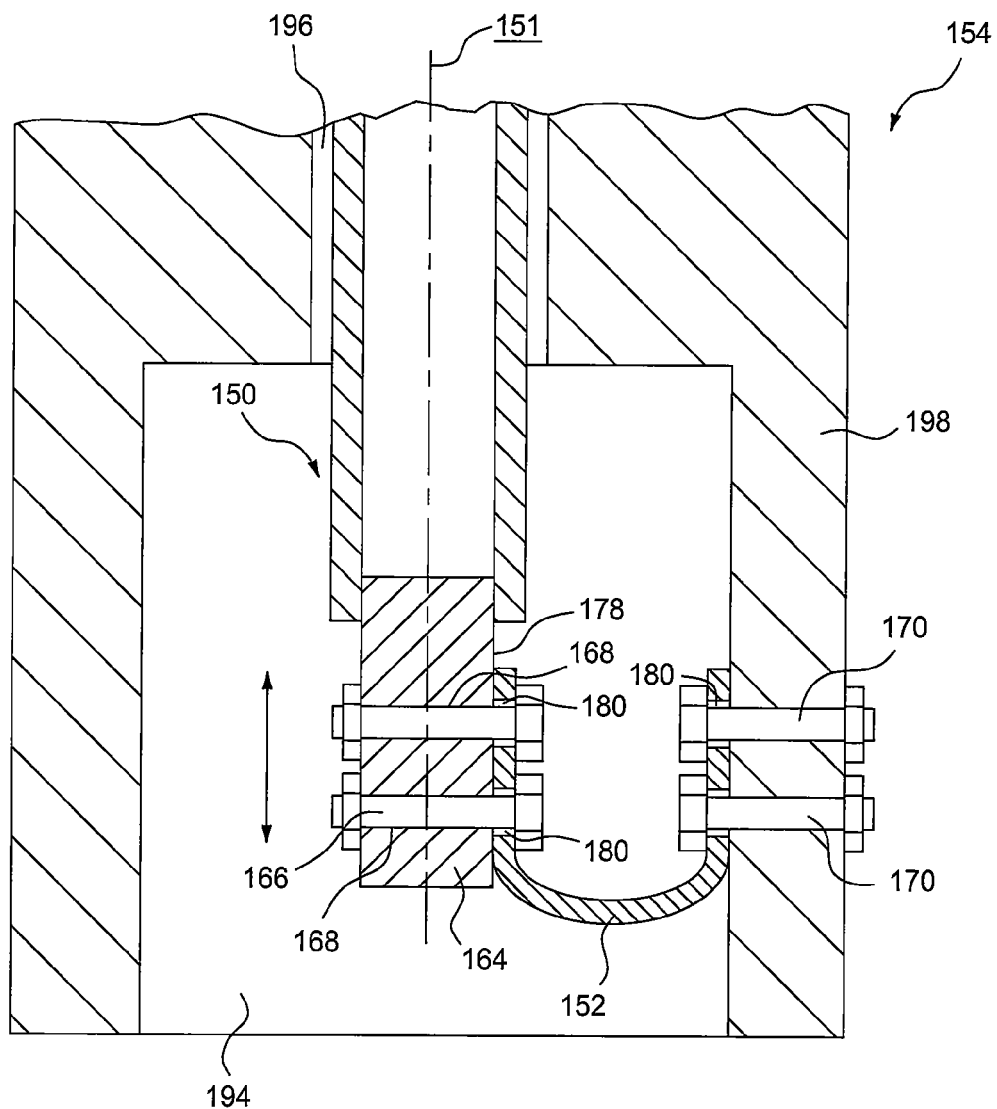
FIG. 5 is a schematic sectional view of a strap for connecting a RF power according to one embodiment of the present invention.

FIG. 5 is a schematic partial sectional view of the substrate support 104 showing the connection between the RF conducting rod 150, the flexible strap 152 and the cooling connector 154 according to one embodiment of the present invention. The flexible strap 152 may be coupled to the solid end 164 of the RF conducting rod 150 by mechanical fasteners such as screws and bolts, or by a fabrication process such as sintering, hot pressing, and other methods. As shown in FIG. 5, one or more bolts 168 fasten the flexible strap 152 to the solid end 164 of the RF conducting rod 150 through the through holes 166. The bolts 168 secure the flexible strap 152 against the flattened surface 178 on the solid end 164 therefore obtaining a solid connection.

The flexible strap 152 may be a strip of elongated thin plate or wire that provides flexibility between the RF conducting rod 150 and the sidewall 198 of the cooling connector 154.

The flexible strap 152 may have one or more through holes 180 for fastening to the RF conducting rod 150 and the cooling connector 154. The RF conducting rod 150 being elongated may incur significant amount of thermal expansion along the axis 151 when being heated that the solid end 164 may move vertically. The flexibility of the flexible strap 152 allows the solid end 164 to move and still maintain electrical contact. In one embodiment, the flexible strap 152 may be a thin plate of a metal with minimal electrical resistance. The flexible strap 152 may have thickness of between about 0.127 mm (0.005 inch) to about 0.5 mm (0.020 inch). For example, the flexible strap 152 may be made of beryllium and/or nickel doped with gold to reduce erosion. Alternative the flexible strap 152 can be made from braided copper wire that is plated with gold to reduce erosion.

As shown in FIG. 5, one or more bolts 170 may be used to fasten the flexible strap 152, the cooling connector 154 and the shaft 124. The cooling connector 154 may be made of a metal with minimal electrical resistance, such as beryllium and/or nickel doped with gold to reduce erosion.

The RF conducting rod 150 provides several improvements over the state of the art RF conductor. Particularly, by including a hollow portion, the RF conducting rod 150 reduces heat conduction from the support body 120 without increasing RF resistance. Heat conductivity of a component is generally proportional to the size of the sectional area while RF resistance relates to the size of the surface area. By including a hollow portion, the RF conducting rod 150 reduces size of the sectional area without reducing size of the surface area, thus reducing heat conduction without increasing RF resistivity.

Additionally, the elongated hollow body 156 of the RF conducting rod 150 also reduces RF heating. RF heating is caused by a RF current flowing through a conductive path, such as a grounding path, and is proportional to the RF resistance in the conductor. The main contribution to the RF resistance of the RF conducting rod 150 comes from the connection of the RF conducting rod 150 with the RF electrode 130 and the flexible strap 152, width of the surface area along with the RF current travels, and the length of the RF conducting rod 150. The design of a hollow rod can have a larger diameter to reduce RF resistivity and prevent RF heating without increase heat conduction.

For example, when the support body 120 is heated to 560 degree Celsius, the shaft 124 is heated to 80 degree Celsius, and the RF power is at 1600 Watt, when a solid conducting rod is used to connect the RF electrode 130 and the flexible strap 152, the flexible strap 152 is heated to 290 degree Celsius. Under the same condition, when the RF conducting rod 150 with a hollow portion is used, the flexible strap 152 is heated only to 220 degree Celsius. The lowered temperature can effectively reduce erosion components in the RF path, avoid arcing and improving overall performance of a plasma processing chamber.

Even though, embodiments of described above are related to RF grounding in a heated substrate support, the RF conducting rod with hollow portions according to embodiments of the present invention may be used in any RF connecting situation when reduced RF resistivity and/or reduced heat conductivity are desired.

While the foregoing is directed to embodiments of the present invention, other and further embodiments of the invention may be devised without departing from the basic scope thereof, and the scope thereof is determined by the claims that follow.

The invention claimed is:

1. An apparatus for conducting RF power, comprising:
an elongated hollow body having a sidewall enclosing an inner volume, wherein the elongated hollow body has a venting port formed through the sidewall, and the venting port fluidly connects the inner volume to an exterior of the sidewall;
a first solid connector extending from a first end of the elongated hollow body; and
a second solid connector extending from a second end of the elongated hollow body, wherein each of the elongated hollow body, the first solid connector and the second solid connector is formed from an electrically conductive material.

2. The apparatus of claim 1, wherein the elongated hollow body is a hollow cylinder.

3. The apparatus of claim 1, wherein the elongated hollow body, the first solid connector and the second solid connector are formed from the same metal.

4. The apparatus of claim 3, wherein the elongated hollow body is joined to the first and second solid connectors by electron beam welding or laser welding.

5. The apparatus of claim 4, wherein the metal is nickel.

6. The apparatus of claim 1, wherein the first solid connector has one or more mounting features.

7. A substrate support comprising:
a support body having a substrate supporting surface, wherein the support body is formed from a non-electrically-conductivity material;
a hollow shaft extending from the support body;
an RF electrode embedded in the support body; and
an RF connector disposed in the hollow shaft and coupled to the RF electrode, wherein the RF connector comprises:
an elongated hollow body having a sidewall enclosing an inner volume;
a first solid connector extending from a first end of the elongated hollow body; and
a second solid connector extending from a second end of the elongated hollow body, wherein each of the elongated hollow body, the first solid connector and the second solid connector is formed from an electrically conductive material, and the second solid connector is coupled to the RF electrode.

8. The substrate support of claim 7, further comprising:
a heating element embedded in the support body.

9. The substrate support of claim 8, wherein the sidewall of the elongated hollow body has a venting port formed therethrough, and the venting port fluidly connects the inner volume to an exterior of the sidewall.

10. The substrate support of claim 9, wherein the venting port is closer to the first solid connector than to the second solid connector.

11. The substrate support of claim 9, wherein the elongated hollow body, the first solid connector and the second solid connector are formed from the same metal.

12. The substrate support of claim 11, wherein the elongated hollow body is joined to the first and second solid connectors by electron beam welding or laser welding.

13. The substrate support of claim 12, wherein the metal is nickel.

14. The substrate support of claim 9, wherein the RF electrode is a metal mesh, and the second solid connector is coupled to the RF electrode by brazing.

15. A method for generating a plasma, comprising:
applying an RF power source between a chamber component and a substrate support, wherein the substrate support comprises:
a support body having a substrate supporting surface, wherein the support body is formed from a non-electrically-conductivity material;
a hollow shaft extending from the support body;
an RF electrode embedded in the support body; and
an RF connector disposed in the hollow shaft and coupled to the RF electrode, wherein the RF connector comprises:
an elongated hollow body having a sidewall enclosing an inner volume;
a first solid connector extending from a first end of the elongated hollow body; and
a second solid connector extending from a second end of the elongated hollow body, wherein each of the elongated hollow body, the first solid connector and the second solid connector is formed from an electrically conductive material, the second solid connector is coupled to the RF electrode, and the first solid connector is coupled to an RF ground terminal or an RF hot terminal of the RF power source.

16. The method of claim 15, further comprising heating a substrate disposed on the substrate support with a heating element embedded in the support body.

17. The method of claim 16, wherein the sidewall of the elongated hollow body has a venting port formed therethrough, and heating the substrate comprises venting the inner volume of the elongated hollow body through the venting port.

18. The method of claim 17, wherein the chamber component is a showerhead disposed over the substrate support.

19. The method of claim 18, wherein applying the RF power comprises connecting a RF grounding terminal to the RF electrode embedded in the substrate support.

* * * * *